United States Patent [19]

Cartz et al.

[11] Patent Number: 4,504,964
[45] Date of Patent: Mar. 12, 1985

[54] LASER BEAM PLASMA PINCH X-RAY SYSTEM

[75] Inventors: Louis Cartz, Milwaukee, Wis.; Arnold Weiss, Minneapolis, Minn.; Herman P. Schutten, Milwaukee, Wis.; Gordon B. Spellman, Mequon, Wis.; Stanley V. Jaskolski, Sussex, Wis.; Peter H. Wackman, deceased, late of Wauwatosa, Wis., by Connie M. Wackman, personal representative

[73] Assignee: Eaton Corporation, Cleveland, Ohio

[21] Appl. No.: 420,557

[22] Filed: Sep. 20, 1982

[51] Int. Cl.³ .............................................. G21G 3/00
[52] U.S. Cl. ...................................... 378/119; 378/34
[58] Field of Search ................ 378/119, 122, 123, 34; 313/231.61; 356/313, 314, 316, 318; 73/28

[56] References Cited

U.S. PATENT DOCUMENTS

| | | | |
|---|---|---|---|
| 3,680,959 | 8/1972 | Schuch et al. | 356/313 |
| 3,746,860 | 7/1973 | Shatas et al. | 378/119 |
| 4,042,848 | 8/1977 | Lee | 378/119 |
| 4,184,078 | 1/1980 | Nagel et al. | |
| 4,201,921 | 5/1980 | McCorkle | |
| 4,220,414 | 9/1980 | Barringer | 356/318 |

OTHER PUBLICATIONS

Shatas et al., "Soft X-Rays from a Laser-Heated Dense Plasma Focus," J.O.A.P., v. 42, N. 13, pp. 5884-5886.

Primary Examiner—Alfred E. Smith
Assistant Examiner—T. N. Grigsby
Attorney, Agent, or Firm—Andrus, Sceales, Starke & Sawall

[57] ABSTRACT

A system is provided for producing plasma pinch X-rays usable in X-ray lithography. Ionized heated plasma vapor is repeatably generated directly from solid material by impingement of a plurality of circumferentially spaced laser beams to generate an annulus of plasma. X-rays are generated by passing high current through the annular plasma in an axial gap between the solid material target electrode and another electrode, causing magnetic field radial inward plasma pinching to a central constricted area further heating the plasma and emitting X-rays. A central axially directed laser may further heat the plasma in the pinched area.

20 Claims, 2 Drawing Figures

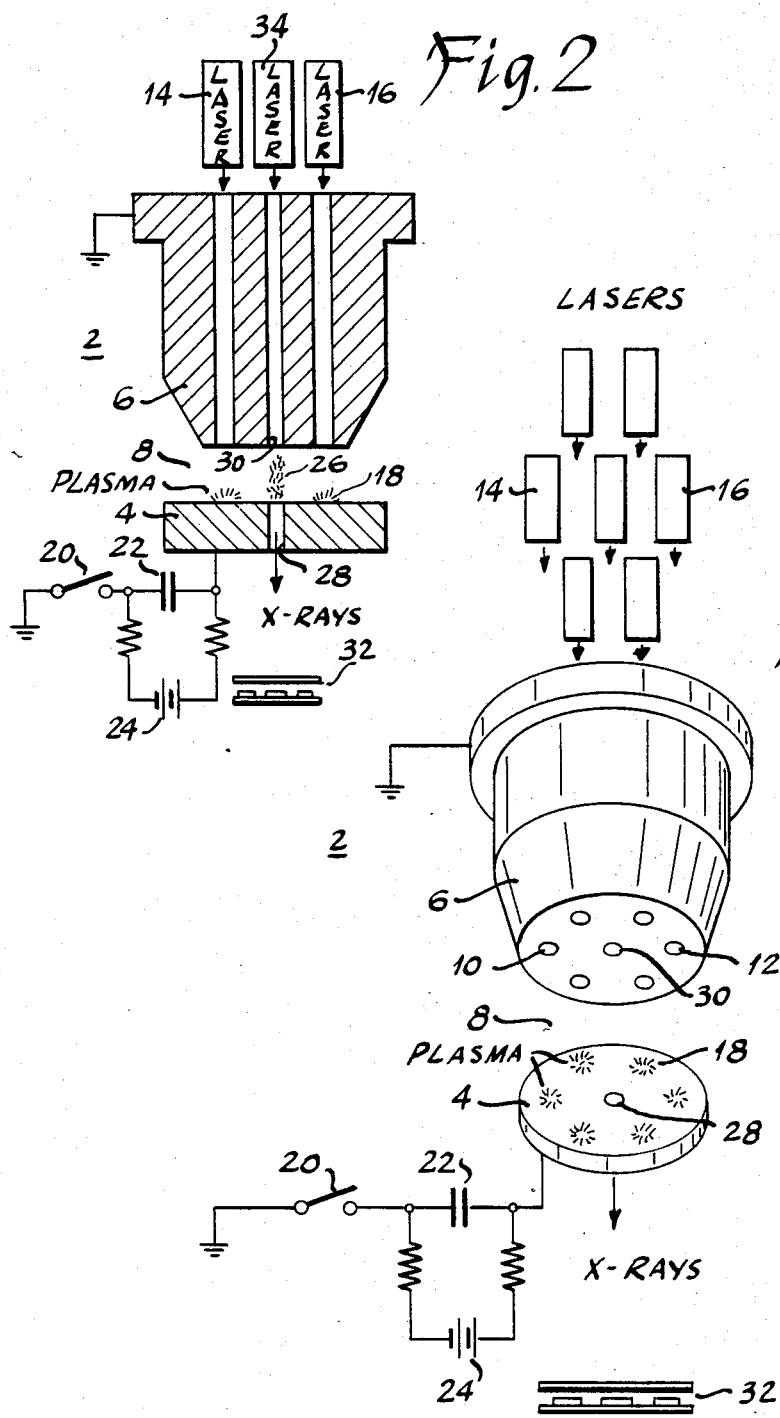

LASER BEAM PLASMA PINCH X-RAY SYSTEM

Technical Field

The invention relates to systems for generating X-rays from plasma, and usable in fine line lithography for semiconductors.

BACKGROUND

The invention arose from efforts to develop an X-ray system for use in manufacturing microelectronic circuits. With the ever increasing miniaturization of semiconductor integrated circuitry, optical lithography does not afford the necessary resolution due to diffraction effects along mask lines. X-ray lithography provides greater resolution due to the shorter wave length of X-rays.

Various types of X-ray sources are known for use in X-ray lithography. These systems are costly, and have not yet achieved a consistently high level of performance and intensity necessary for high production rate lithography. Various of these systems are cumbersome, and are not amenable to repetitive manufacturing sequences.

In the conventional type of X-ray system, a metal target is continuously bombarded by a stream of high energy electrons. Most of the energy is dissipated in the target in the form of heat, while a very small fraction is emitted in the form of relatively high energy X-rays. This type of source system has low intensity and low production rates. The high heat generation requires complicated mechanical designs to dissipate the heat, such as rotating anodes or high velocity water cooling.

In another type of X-ray system, commonly called the gas puff type, a neutral non-ionized gas is pumped in cylindrical form between a pair of electrodes. High current is then passed between the electrodes, which heats and ionizes the gas, thus creating plasma. The high current also causes magnetic field pinching of the plasma to a smaller constricted area, i.e. parallel lines of plasma create magnetic fields which cause attraction of the current lines towards each other. The magnetic field pinching and compression of the plasma further heats the plasma and causes X-ray emission.

In an alternate gas puff type X-ray system, the cold, neutral gas is pre-ionized, for example electrically, or by radio frequency radiation setting up a standing wave which ionizes the gas. This alternate gas puff system affords better performance, but is extremely costly. Mechanical valving or the like is needed for introduction of the gas, as in the original gas puff system, and there is required the additional equipment for the intermediate pre-ionization stage. Also as in the original gas puff system, the X-ray generating material selection is limited by the requirement that the material be a gas.

In another known X-ray system, called the exploding wire type, high current explodes and vaporizes a circumferential array of wires to a vapor plasma. The high current also causes magnetic field pinching of the vapor plasma, generating X-rays. The same current which generates the plasma also generates the X-rays. The plasma and the X-rays are generated in the same area and at the same time. A drawback of the exploding wire type X-ray system is its one shot nature. The wires must be replaced after each firing, and the system is thus not amenable to cost effective use in manufacturing sequences.

In another type of X-ray system, as shown in McCorkle U.S. Pat. No. 4,201,921, plasma is generated by passing a high current along the inner capillary wall of a hollow tubular insulator. X-rays are generated by directing an electron beam on the plasma.

In another known X-ray system, as shown in Nagel et al U.S. Pat. No. 4,184,078, laser beam bombardment of a target generates plasma which emits X-rays.

SUMMARY

The present invention provides a simple, low cost X-ray system. Though not limited thereto, the invention is particularly suitable for use in X-ray lithography, including cost effective repetitive manufacturing use.

The invention provides the combination of plasma generation directly from a solid material target by laser beam impingement, and X-ray generation by passing high current axially through the plasma causing magnetic field radial inward plasma pinching. Both the plasma generation and the X-ray generation are rapidly repeatable and well suited to manufacturing efficiency. This system further enables accurate control of both the plasma generation and the X-ray generation.

BRIEF DESCRIPTION OF THE DRAWINGS

FIG. 1 is a schematic exploded pictorial view of the X-ray system in accordance with the invention.

FIG. 2 is a schematic sectional view of the X-ray system of FIG. 1.

DETAILED DESCRIPTION

X-ray system 2 in FIGS. 1 and 2 includes a pair of electrodes 4 and 6 spaced by an axial gap 8 therebetween. Electrode 6 is a cylindrical member having a plurality of circumferentially spaced axial passages such as 10 and 12 therethrough. A plurality of laser sources such as 14 and 16 direct laser beams axially through the axial passages such as 10 and 12 such that a cylindrical array of laser beams impinge on electrode 4 in an annular pattern as shown at 18. Electrode 6 may alternatively have an annular passage therethrough, in place of plural passages such as 10 and 12.

Electrode 4 is a target electrode of a given substance, for example aluminum, for producing plasma vapor in response to laser impingement thereon. Upon closing switch 20, a large storage capacitor 22, charged from voltage source 24, discharges electrode 4 across axial gap 8 to electrode 6. This passes high current through the plasma annulus in gap 8, causing magnetic field pinching of the plasma radially inwardly. This radial inward pinching of the plasma further heats the plasma and causes X-ray emission from the pinched plasma. Referring to FIG. 2, the annular pattern of the plasma before pinching is shown at 18, and the constricted pinched plasma is shown at 26.

The X-rays are emitted through an axial passage 28 in the target electrode 4 coaxially aligned with the centrally pinched plasma 26. Alternatively, the X-rays may be emitted back through a central axial passage 30 through the other electrode 6. The axial emission orientation of the X-rays enables placement of a masked semiconductor substrate 32 normal to the axial direction of emission for impingement by the X-rays.

An additional laser beam from another laser source 34 may be directed through central axial passage 30, regardless of which direction X-rays are emitted. This additional central laser beam impinges on the radially inwardly pinched central plasma 26 in gap 8 and further heats the pinched plasma.

In an alternative, a single laser source may be used with a beam splitter, such as mirror or prism means, to provide a plurality of circumferentially spaced laser beams.

It is recognized that various modifications are possible within the scope of the appended claims.

We claim:

1. A method for producing X-rays comprising:
   generating plasma directly from solid material by laser beam impingement; and
   generating X-rays by passing high current rectilinearly axially through said plasma causing radially inward magnetic field plasma pinching perpendicularly to the rectilinear axial current flow, the X-ray emitting plasma pinched region being at a different location than and spaced radially inwardly of the laser beam impingement location, said laser beam being directed in an axial path parallel to or colinear with the current axis.

2. A method for producing X-rays comprising:
   repeatably generating plasma in an annulus directly from solid material by laser beam impingements; and
   generating X-rays by passing high current through said plasma causing magnetic field plasma pinching.

3. The invention according to claim 2 comprising directing a plurality of circumferentially spaced laser beams axially on a solid target electrode, and axially passing high current through said plasma across an axial gap between said target electrode and another electrode to cause radial inward magnetic field pinching of said plasma.

4. The invention according to claim 3 comprising directing said laser beams through a circumferential array of axial passages in said other electrode.

5. The invention according to claim 4 further comprising directing an additional laser beam through a central axial passage in said other electrode to impinge on the radially inwardly pinched plasma in the gap between said electrodes and further heat said pinched plasma.

6. The invention according to claim 4 comprising communicating said X-rays axially from said gap.

7. The invention according to claim 6 comprising communicating said X-rays through an axial passage in said target electrode.

8. The invention according to claim 6 comprising communicating said X-rays back through an axial passage in said other electrode in the opposite direction of said laser beams.

9. A method for producing X-rays usable for fine line lithography, comprising:
   repeatably generating plasma in an annulus directly from solid material by laser beam impingement; and
   generating X-rays by passing high current axially through said plasma causing radial inward magnetic field pinching of said plasma annulus.

10. The invention according to claim 9 comprising communicating said X-rays axially from said pinched plasma and placing a masked semiconductor substrate normal to said axis for impingement by said X-rays.

11. Apparatus for producing X-rays comprising:
    means for generating plasma directly from solid material by laser beam impingement along a plurality of axially extending laser beam paths impinging said solid material at a plurality of radially spaced locations; and
    means for generating X-rays by passing high current through said plasma between axially spaced electrodes causing radially inward magnetic field plasma pinching, the X-ray emitting plasma pinched region being at a different location than and spaced radially inwardly of the laser beam impingment location.

12. Apparatus for producing X-rays comprising:
    means for repeatably generating plasma in an annulus directly from solid material by laser beam impingement; and
    means for generating X-rays by passing high current through said plasma causing magnetic field plasma pinching.

13. The invention according to claim 12 comprising a solid target electrode, and another electrode spaced from said target electrode by an axial gap, said other electrode having a plurality of circumferentially spaced axial passages therethrough, and means for directing a plurality of circumferentially spaced laser beams axially through respective said circumferential array of axial passages in said other electrode such that said circumferential array of laser beams impinge said target electrode in an annular pattern to generate said plasma, and means for discharging a high current axially between said electrodes through said annular plasma in said gap to cause radial inward magnetic field pinching of said plasma to a central constricted area.

14. The invention according to claim 13 wherein said other electrode further has a central axial passage therethrough.

15. The invention according to claim 14 further comprising central laser beam means for directing a laser beam through said central axial passage in said other electrode to impinge said radially inwardly pinched plasma in said constricted area in said gap between said electrodes to further heat said pinched plasma.

16. The invention according to claim 13 wherein said target electrode has a central axial passage therethrough coaxially aligned with said central constricted radially pinched plasma for emitting X-rays therethrough.

17. A method for producing X-rays comprising:
    initially generating plasma directly from solid material by axial laser beam impingment at radially spaced locations; and
    subsequently generating X-rays by passing high current axially through said plasma causing radially inward magnetic field plasma pinching, said laser beam impingement occuring prior to said plasma pinching.

18. The invention according to claim 17 wherein the X-ray emitting plasma pinched region is at a different location than the laser beam impingement location.

19. Apparatus for producing X-rays comprising:
    means for initially generating plasma directly from solid material by axial laser beam impingement at radially spaced locations; and
    means for subsequently generating X-rays by passing high current axially through said plasma causing radially inward magnetic field plasma pinching, said laser beam impingement occuring prior to said plasma pinching.

20. The invention according to claim 19 wherein the X-ray emitting plasma pinched region is at a different location than the laser beam impingement location.

* * * * *